(12) United States Patent
Chien

(10) Patent No.: US 9,964,578 B1
(45) Date of Patent: May 8, 2018

(54) CAR CIRCUIT TESTER

(71) Applicant: PEACEFUL THRIVING ENTERPRISE CO., LTD., Changhua County (TW)

(72) Inventor: Shih-Hsiang Chien, Changhua County (TW)

(73) Assignee: PEACEFUL THRIVING ENTERPRISE CO., LTD., Changhua County (TW)

( * ) Notice: Subject to any disclaimer, the term of this patent is extended or adjusted under 35 U.S.C. 154(b) by 0 days. days.

(21) Appl. No.: 15/343,232

(22) Filed: Nov. 4, 2016

(51) Int. Cl.
*G01R 31/00* (2006.01)
*G01R 31/28* (2006.01)

(52) U.S. Cl.
CPC ....... *G01R 31/005* (2013.01); *G01R 31/2874* (2013.01)

(58) Field of Classification Search
CPC .............. G01R 31/005; G01R 31/2874; G01R 31/3278; G01R 31/2886; G01R 31/2889; G01R 31/2831; G01R 31/3686; G01R 31/3682; G01R 1/20; G01R 1/06788; G01R 1/06716; G01R 1/06722; G01R 1/06711; G01R 1/06783; G01R 1/06766; G01R 1/06777; G01R 1/22; G01R 1/04
USPC ..... 324/754.01–754.04, 435, 149, 72.5, 415, 324/718, 133, 503, 522–524, 537
See application file for complete search history.

(56) References Cited

U.S. PATENT DOCUMENTS

| | | | |
|---|---|---|---|
| 4,999,574 A * | 3/1991 | Stephens | G01R 19/16557 324/133 |
| 5,359,290 A * | 10/1994 | Cervas | F02P 17/00 324/133 |
| 5,672,964 A * | 9/1997 | Vinci | G01R 1/06788 324/133 |
| 6,512,361 B1 * | 1/2003 | Becker | G01R 1/06788 324/133 |
| 7,184,899 B2 | 2/2007 | Cruz | |
| 9,046,564 B1 * | 6/2015 | Griffin | G01R 31/006 |
| 2006/0061367 A1 * | 3/2006 | Chenn | G01R 19/155 324/503 |
| 2009/0206859 A1 * | 8/2009 | Swaim | G01R 1/06788 324/756.03 |
| 2012/0289855 A1 * | 11/2012 | Bieberich | G01K 1/165 600/549 |

* cited by examiner

*Primary Examiner* — Thang Le
(74) *Attorney, Agent, or Firm* — Raymond Y. Chan; David and Raymond Patent Firm

(57) ABSTRACT

A car circuit tester that detects circuit is revealed. The car circuit tester is applied to circuit system and devices of cars for selective measurement of voltage and temperature. The car circuit tester includes a main machine, a sensing part, a processor and a screen. The processor is connected to screen circuit and circuit of the sensing part. The sensing part is in direct contact with an object to be detected and used for inputting voltage signals or temperature signals to the processor. After receiving the signals, the processor outputs parameters to the screen. The parameters are shown on or played through the screen.

15 Claims, 6 Drawing Sheets

CAR CIRCUIT TESTER

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to a car circuit or device tester, and more especially to a car tester that not only detects an electric current in circuits but also detects temperature of devices. The data detected is shown on or played through the screen.

Description of Related Arts

Nowadays vehicles have more complicated design, especially the circuit system. Thus circuit test and maintenance are getting more important. There are various test and maintenance devices for troubleshooting and diagnosis of the complicated circuit available on the market.

Refer to US Pat. No. 7,184,899, an electrical test device being adapted to vehicle electrical circuit system for selective measurement of a plurality of parameters is provided. The electrical test device includes a conductive probe element, a power supply, a processor and a display device. The conductive probe element is placed into contact with the electrical system to provide an input signal related to the parameter of the electrical system detected to the processor.

The probe mentioned above can be used only for detecting electrical circuit voltage and the processor thereof controls all of the functions of the electrical test device including test data from the probe, connection to an external power source, overload, etc. Such design puts the processor under heavy load and the processor starts to overhead. Thus the circuit is faulted easily.

Once one of the circuits of the object being detected is overloaded, the wire with the circuit is kept at high temperature. This may cause burning hazard or risk of fire. Moreover, the temperature of some devices needs to be detected during car maintenance and repair such as radiator temperature, fuel tank temperature, etc. Thus users need to use another set of temperature detector for test and diagnosis of temperature problems of the circuit system.

Thus users need to carry two detectors. One is a voltage tester and the other is a temperature detector for safety test of the circuit system.

Thus there is a need to provide a circuit tester that not only detects voltage of the circuit system but also checks whether the temperature of the system is abnormal. Thus the voltage tester and the temperature detector should be integrated into one device and users don't need to carry many test devices. The circuit tester should easy to use, the number of the test devices users need to carry with is minimized and the production cost is reduced.

SUMMARY OF THE PRESENT INVENTION

Therefore it is a primary object of the present invention to provide a tester that not only detects voltage but also detects temperature of a car circuit system at the same time.

In order to achieve the above object, a car circuit tester according to the present invention includes a main machine disposed with a sensing part. The sensing part is in a probe form and disposed with a component for detecting voltage and a component for temperature detection. Operating components on the main machine include a plurality of buttons. The main machine is built with a processor and a power supply and protection module therein and is disposed with a screen for showing parameters detected thereon. The sensing part is disposed on one end of the main machine and is in contact with a car circuit or device to measure voltage and temperature of the car circuit or the device. Thus the sensing part provides at least one detection signal to the processor built in the main machine. Then a parameter related to the signal is output to the screen for showing data detected. The main machine is operated by the buttons and under control of the processor.

The car circuit tester features on that the sensing part includes a first component and a second component. The first component covers the second component, like a housing. The first component is used for detecting voltage while the second component is a thermal sensor for temperature detection. The second component is completely covered by and tightly connected to the first component. Thereby the second component detects the temperature owing to thermal conductivity of the first component. In the sensing part, a second component can also be partially covered by a first component and a front end of the second component is exposed, without being covered by the first component. Thereby the second component is in direct contact with the circuit to detect temperature directly.

Bothe voltage and temperature are detected at the same time when the sensing part is in direct contact with the car circuit or device. The sensing part sends a voltage signal and a temperature signal to the processor. The processor converts the signals to data to be displayed or played through the screen.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1:
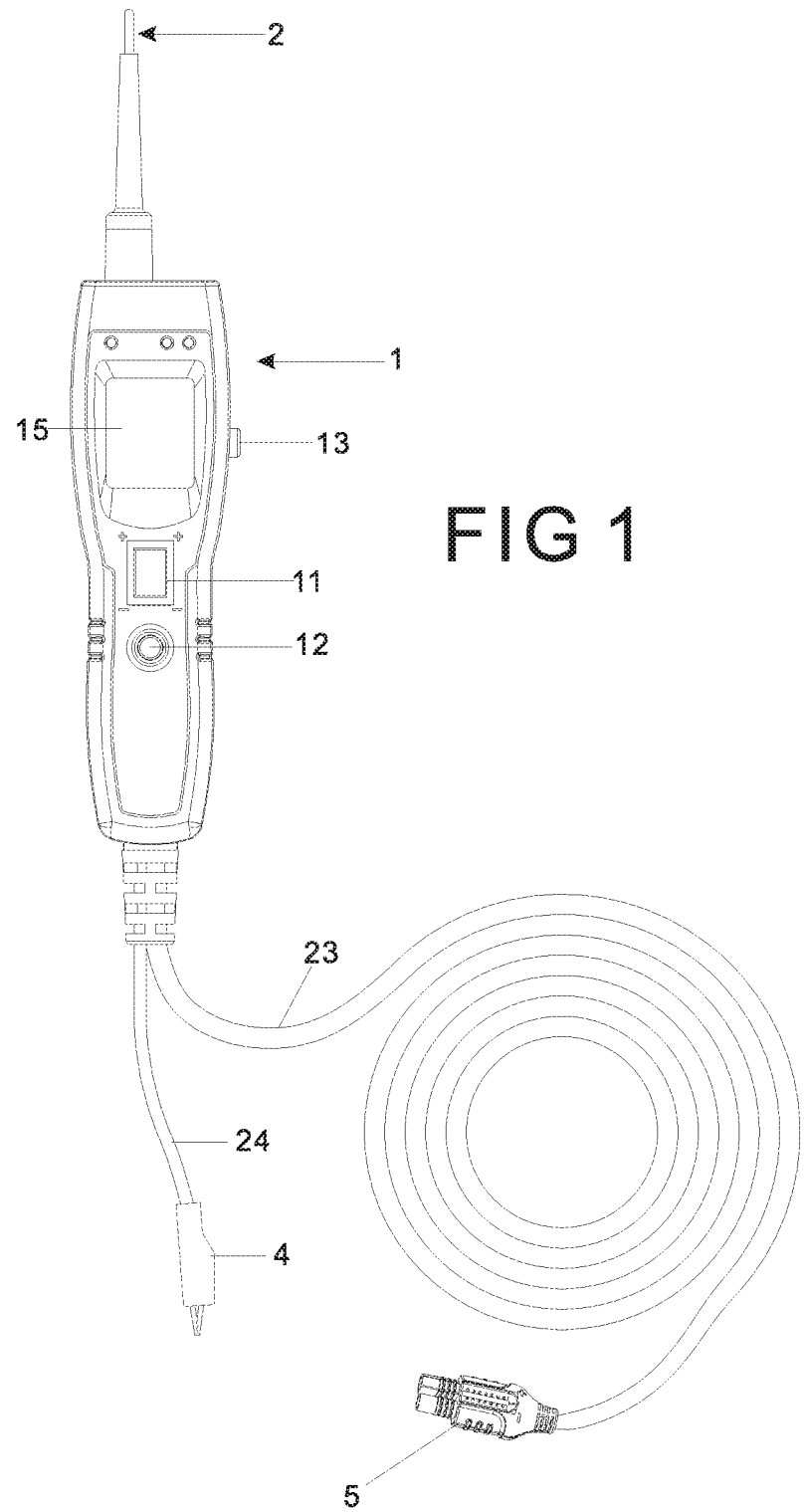
FIG. 1 is a perspective view of an embodiment according to the present invention.

Refer to FIG. 1, a car circuit tester for checking car circuits (electrical connections) and devices according to the present invention mainly includes a main machine 1, and a sensing part 2. The sensing part 2 is disposed on one end of the main machine 1 while a connection part 23 and a grounding wire 24 are arranged at and extended from the other end of the main machine 1. The connection part 23 is used to connect to an external power source. A first assembly part 5 is set on one end of the connection part 23 and a clip 4 is arranged at one end of the grounding wire 24. Operating components on surface of the main machine 1 include a first button 1, a second button 12, and a third button 13. The first button 11 is a switch used for power on/off during detection and the second button 12 is for mode switching. The third button 13 pops out for warning when an overload condition occurs and a protection trip command is provided by a first component 21 that monitors current magnitude of the whole circuit system.

A screen 15 is used to display test parameters. The electrical signals/parameters of the circuit system such as voltage and temperature are detected by the sensing part 2. Then the sensing part 2 sends the electrical signals to a processor 14 built in the main machine 1 for being converted into data to be shown on the screen 15, played from a speaker 16, or outputting a warning sound through the speaker 16 owing to an abnormal signal.

Figure 2:
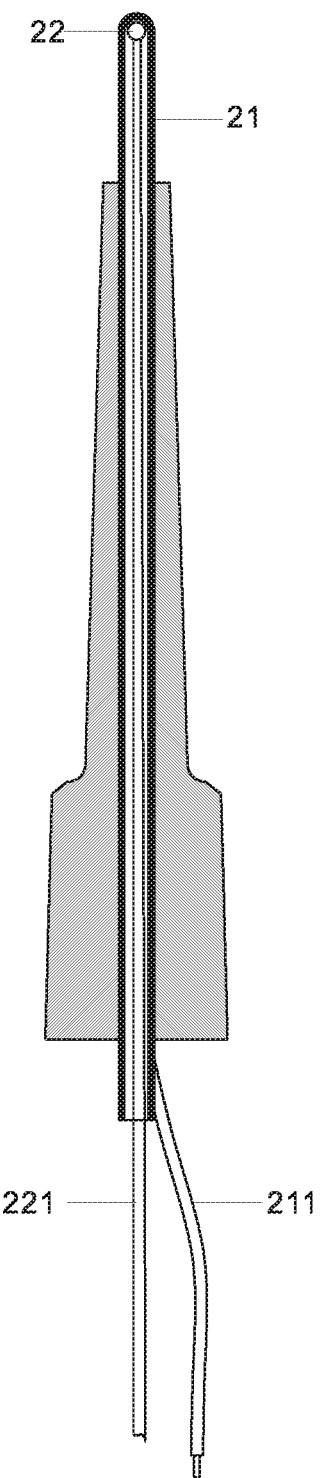
FIG. 2 is a schematic drawing showing an embodiment of a sensing part in use of an embodiment according to the present invention.

Refer to FIG. 2, the sensing part 2 is a probe and having a first component 21 and a second component 22. The first component 21 covers the second component 22, like a housing and the second component 22 is hidden inside the first component 21. The first component 21 is a conductive metal housing for detecting voltage and sending voltage signals. The second component 22 made from conductive material is used for detecting temperature, sending temperature signals and having a surface thereof is covered by an insulation layer. The second component 22 can also be made from non-conductive material and having no insulation layer covered on a surface thereof. The first component 21 and the second component 22 are tightly connected to form the sensing part 2 in the form of probe. The second component 22 detects the temperature owing to thermal conductivity of the first component 21.

Figure 3:
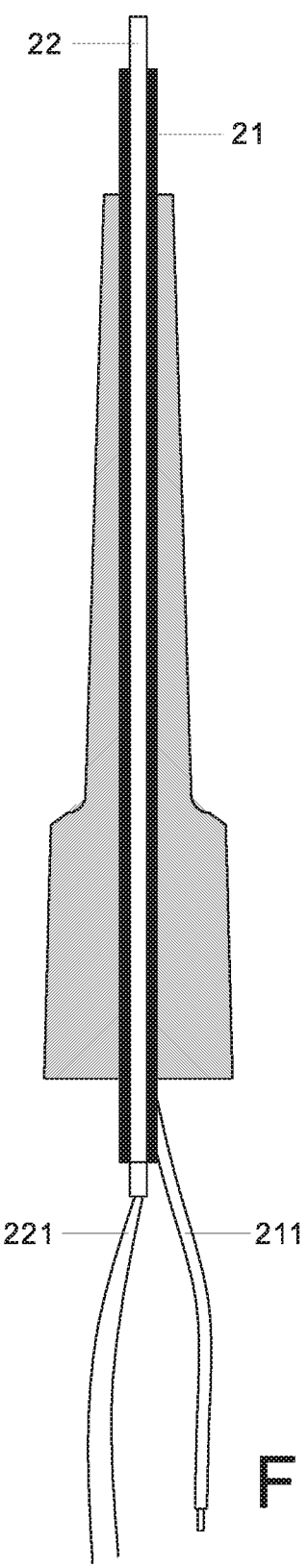
FIG. 3 is a schematic drawing showing another embodiment of a sensing part in use of an embodiment according to the present invention.
Figure 4:
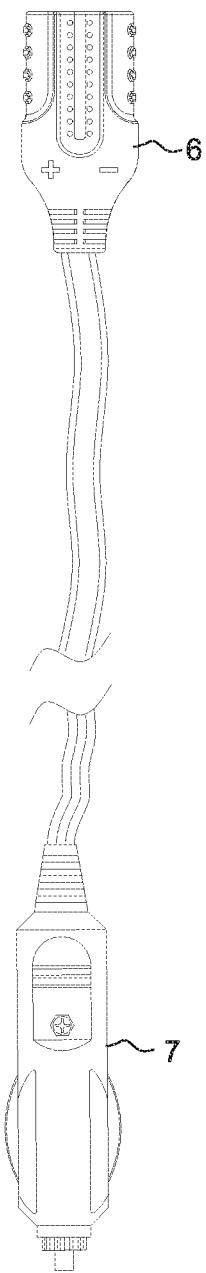
FIG. 4 is a schematic drawing showing a second component of an embodiment according to the present invention.

The first component 21 is connected to an electronic-property detection wire 211 that sends the voltage signals to the processor 14. The second component 22 is connected to a temperature measuring wire 221 that transmits the temperature signals to the processor 14. Refer to FIG. 3, another embodiment is revealed. A part of the second component 22 is mounted in the first component 21 while a front end of the second component 22 is exposed, without being covered by the first component 21. The first component 21 is a conductive metal housing while the second component 22 is made from conductive material. The first component 21 detects and measures electronic signals passed through the circuit system including voltage, current, frequency and resistance. Thereby the second component 22 is directly in contact with the circuit to get the temperature signal. An average value of the detected signal and the measured signal is shown on the screen 15. The results of transient voltage test, voltage stability test, frequency detection and the temperature signal are also shown or played through the screen 15.

The first button 11 is connected to the connection part 23 to be connected to/or separated from an external power source by the connection part 23.

The second button 12 is for switching the test mode. The test modes include temperature test mode, electronic signal test mode and parameter mode. The second button 12 is used to select one of the modes mentioned above.

The third button 13 is used as a trip circuit for opening or disconnecting the circuit when an overload condition occurs.

The third button 13 is arranged at one surface of the main machine 1. It's an elastic button maintained at the pressed state and being popped from the surface of the main machine 1 when the overload occurs.

The screen 15 is a liquid crystal display used for indicating the mode selected such as the temperature test mode, electronic signal test mode or parameter mode selected. Users operate the second button 12 to switch the mode according to their needs. The second button 12 is connected to the processor 14 that performs mode switch of the sensing part 2 and the mode selected is shown on the screen 15.

When the sensing part 2 is in contact with circuit equipment directly, it detects both voltage and temperature at the same time and sends the voltage and temperature signals to the processor 14. Then the voltage and the temperature signals are converted into data by the processor 14 to be displayed or read out through the screen 15.

Figure 5:
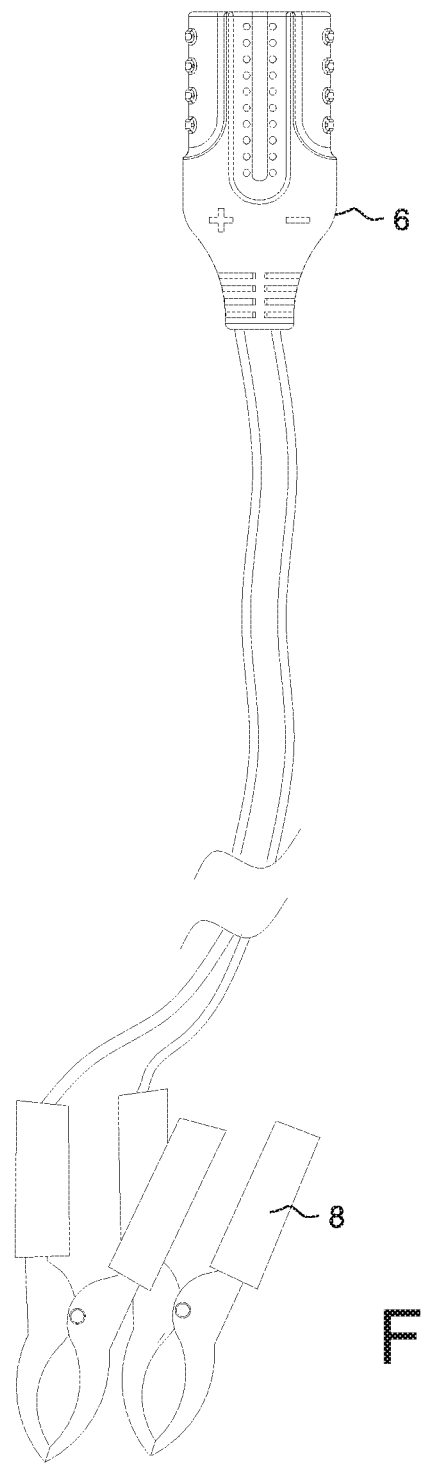
FIG. 5 is a schematic drawing showing a second component of another embodiment according to the present invention.
Figure 6:
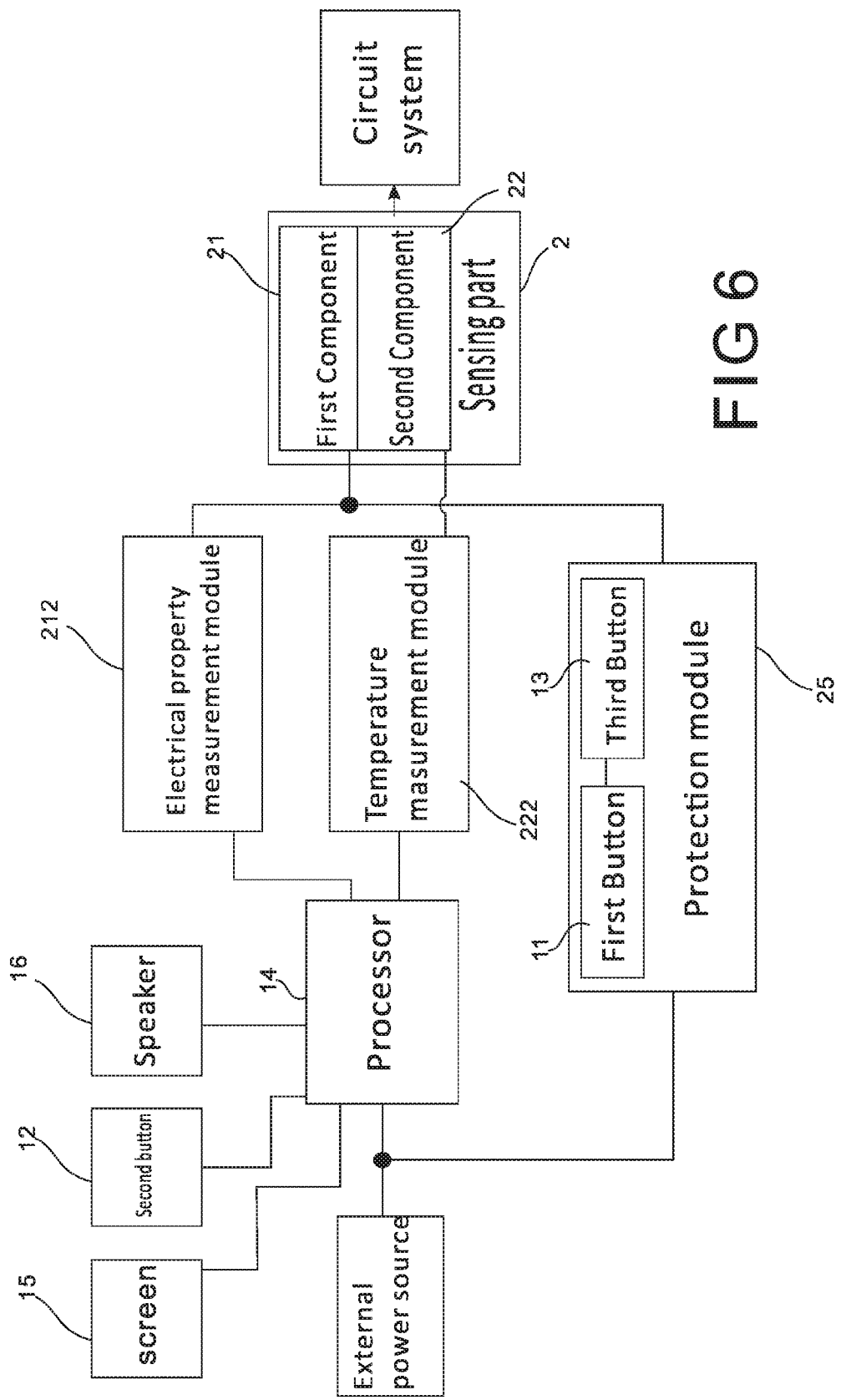
FIG. 6 is a block diagram of an embodiment of a car circuit tester according to the present invention.

Refer to FIG. 6, one end of a second assembly part 6 connected to a wire is further connected to a contact element 7 while the other end of the second assembly part 6 is connected to the first assembly part 5 connected with the connection part 23. The contact element 7 is plugged into a cigarette lighter receptacle in a car to get electric power. Then the electric power is transmitted to the main machine 1 through the first assembly part 5 and the second assembly part 6. As shown in FIG. 5, one end of the second assembly part 6 connected to the wire is further connected to a set of clamps 8. The clamps 8 are used for connection to positive and negative electrodes of an automotive battery/ or a common battery respectively to get electric power. Then the power obtained is delivered to the main machine 1 through the first assembly part 5 and the second assembly part 6.

Refer to FIG. 6, the sensing part 2 (the first component 21/ the second component 22) is used to detect electrical systems. The signal detected is respectively delivered to the processor 14 by the first component 21 and the second component 22 through an electrical property measurement module 212 and a temperature measurement module 222. The processor 14 converts the signal received into data and sends the data to the screen 15. Thus users can learn the value of the signal detected and results of voltage test, voltage stability test, frequency detection and temperature detected. Or a warning representing voltage or temperature anomalies is output through the speaker 16. Moreover, the main machine 1 is disposed with a power supply and protection module 25. When the first component 21 detects an overload current, an overload signal is directly sent to the power supply and protection module 25 without being passed through the processor 14. Both the circuit of the first button 11 and the circuit of the third button 13 are connected to the power supply and protection module 25. After the power supply and protection module 25 receiving the overload signal, the third button 13 is shifted from the pressed state to the protruding state. It should be noted that the operation of the first button 11 and the third button 13 has nothing to do with the processor 14. The processor 14 only accounts for the sensing part 2, the screen 15, the speaker 16, and the second button 12. The circuit of the second button 12 is connected to the processor 14 and the mode switching thereof is transmitted to and performed in the processor 14. Then the mode used now is shown on the screen 15. The processor 14 is not involved in the operation of overload or on/off of the external power source connected to the connection part 23. The power supply and protection module 25 is used to deal with the overload or the on/off of the external power source.

Compared with conventional devices, the present invention has the following advantages:

1. The voltage/current and temperatures changes of the object being detected can be measured by only one test device. While detecting the voltage, the sensing part 2 can also measure the temperature and deliver the temperature detected to the processor 14. Then data of temperature and/or voltage is shown on the screen 15. The temperature and the voltage can be measured at once by contacting the sensing part 2 of the present invention in contact with the object being detected.

2. The processor 14 only takes charge of operation of the sensing part 2, the screen 15, the speaker 16 and the second button 12, without dealing with the external power source and the power supply and protection module 25 connected by the connection part 23. Thereby the processor 14 will not easily break down owing to overheating caused by current or program overload.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A car circuit tester used for detecting car circuit comprising:
   a main machine disposed with a processor therein;
   a sensing part arranged at one end of the main machine and having circuit connected to the processor;
   a plurality of buttons disposed on the main machine and used for power on/off while detecting the car circuit and mode switching; and
   a screen for display of parameters detected;
   wherein the sensing part is in a probe form and having a first component and a second component; the second component is hidden in the first component while the first component is used as a housing of the second component and tightly connected to the second component to be the probe form; the first component is used for detecting a voltage and transmitting a voltage signal while the second component is used to detect a temperature and transmit a temperature signal; the sensing part not only detects both the voltage signal and the temperature signal at the same time but also sends the voltage signal and the temperature signal to the processor; the processor converts the voltage signal and the temperature signal to data, and sends the data to the screen so that the data is displayed on or played through the screen.

2. The device as claimed in claim 1, wherein the second component is partially hidden in the first component and a front end of the second component is exposed, without being covered by the first component; thereby the second component is in direct contact with the car circuit to detect the temperature.

3. The device as claimed in claim 2, wherein the second component is made from conductive materials and a surface thereof covered by an insulation layer.

4. The device as claimed in claim 3, wherein the second component is made from non-conductive material and having no insulation layer covered on a surface thereof.

5. The device as claimed in claim 1, wherein the plurality of buttons includes a first button that is a switch used for power on/off while detecting the car circuit, a second button for mode switching and a third button that pops out for warning when an overload condition occurs and a protection trip command is provided by the first component that monitors current magnitude of a whole circuit system of the car circuit tester.

6. The device as claimed in claim 1, wherein the main machine is further disposed with a power supply and protection module used for dealing with overload and on/off of an external power source.

7. The device as claimed in claim 1, wherein the processor only takes charge of the sensing part, the screen, the speaker and the second button.

8. A car circuit tester used for detecting car circuit comprising:
   a main machine disposed with a processor therein;
   a sensing part arranged at one end of the main machine and having circuit connected to the processor;
   a plurality of buttons disposed on a surface of the main machine used for turning on/off power transmission during detecting the car circuit and mode switching, and having circuit connected to the processor;
   a screen set on the surface of the main machine, used for display of parameters detected and having circuit connected to the processor;
   wherein the sensing part includes a first component and a second component; the second component is completely hidden in the first component while the first component is used as a housing of the second component and tightly connected to the second component to be in a probe form; the first component is used for detecting and transmitting a voltage signal while the second component is used to detect and transmit a temperature signal; the sensing part not only detects both the voltage signal and the temperature signal at the same time but also sends at least one detection signal to the processor; the processor converts the detection signal into data and outputs the data to the screen to be displayed or played.

9. The device as claimed in claim 8, wherein the second component is made from conductive materials and a surface thereof covered by an insulation layer.

10. The device as claimed in claim 9, wherein the second component is made from non-conductive material and having no insulation layer covered on a surface thereof.

11. The device as claimed in claim 8, wherein the first component is made from conductive metal.

12. The device as claimed in claim 8, wherein the second component is able to be partially hidden in the first component and a front end of the second component is exposed, without being covered by the first component;
    thereby the second component is in direct contact with the car circuit to detect the temperature.

13. The device as claimed in claim 8, wherein the plurality of buttons includes a first button that is a switch used for power on/off while detecting the car circuit, a second button for mode switching and a third button that pops out for warning when an overload condition occurs and a protection trip command is provided by the first component that monitors current magnitude of a whole circuit system of the car circuit tester.

14. The device as claimed in claim 8, wherein the main machine is further disposed with a power supply and protection module used for dealing with overload and on/off of an external power source.

15. The device as claimed in claim 8, wherein the processor only takes charge of the sensing part, the screen, the speaker and the second button.

* * * * *